United States Patent
Tsai et al.

(10) Patent No.: US 10,685,943 B2
(45) Date of Patent: Jun. 16, 2020

(54) SEMICONDUCTOR CHIP PACKAGE WITH RESILIENT CONDUCTIVE PASTE POST AND FABRICATION METHOD THEREOF

(71) Applicant: MEDIATEK INC., Hsin-Chu (TW)

(72) Inventors: Shiann-Tsong Tsai, Hsinchu (TW); Hsueh-Te Wang, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/701,456

(22) Filed: Sep. 12, 2017

(65) Prior Publication Data
US 2018/0006002 A1    Jan. 4, 2018

Related U.S. Application Data

(63) Continuation-in-part of application No. 15/063,433, filed on Mar. 7, 2016, now Pat. No. 9,842,831.
(Continued)

(51) Int. Cl.
*H01L 25/16* (2006.01)
*H01L 23/29* (2006.01)
(Continued)

(52) U.S. Cl.
CPC .......... *H01L 25/16* (2013.01); *H01L 21/4832* (2013.01); *H01L 21/563* (2013.01);
(Continued)

(58) Field of Classification Search
CPC ....... H01L 25/16; H01L 25/50; H01L 23/293; H01L 24/03; H01L 24/06; H01L 24/14;
(Continued)

(56) References Cited

U.S. PATENT DOCUMENTS 5,476,211 A * 12/1995 Khandros ............ B23K 1/0016
228/180.5
5,917,707 A *  6/1999 Khandros ............ G01R 1/0466
361/776
(Continued)

FOREIGN PATENT DOCUMENTS

CN    101764113 A    6/2010
CN    103178054 A    6/2013
(Continued)

OTHER PUBLICATIONS

Shiann-Tsong Tsai, Title: Method for Fabricating a Semiconductor Package, pending U.S. Appl. No. 15/805,097, filed Nov. 6, 2017.

*Primary Examiner* — Alexander O Williams
(74) *Attorney, Agent, or Firm* — Wolf, Greenfield & Sacks, P.C.

(57) ABSTRACT

A semiconductor chip package includes a substrate; a semiconductor die mounted on the substrate, wherein the semiconductor die comprises a bond pad disposed on an active surface of the semiconductor die, and a passivation layer covering perimeter of the bond pad, wherein a bond pad opening in the passivation layer exposes a central area of the bond pad; a conductive paste post printed on the exposed central area of the bond pad; and a bonding wire secured to a top surface of the conductive paste post. The conductive paste post comprises copper paste.

14 Claims, 15 Drawing Sheets

Related U.S. Application Data

(60) Provisional application No. 62/445,278, filed on Jan. 12, 2017, provisional application No. 62/442,473, filed on Jan. 5, 2017, provisional application No. 62/190,401, filed on Jul. 9, 2015, provisional application No. 62/161,591, filed on May 14, 2015.

(51) Int. Cl.
| | | |
|---|---|---|
| *H01L 23/00* | (2006.01) | |
| *H01L 25/065* | (2006.01) | |
| *H01L 25/00* | (2006.01) | |
| *H01L 21/56* | (2006.01) | |
| *H01L 23/538* | (2006.01) | |
| *H01L 21/48* | (2006.01) | |
| *H01L 23/31* | (2006.01) | |
| *H01L 23/495* | (2006.01) | |

(52) U.S. Cl.
CPC ........ *H01L 23/293* (2013.01); *H01L 23/3135* (2013.01); *H01L 23/5389* (2013.01); *H01L 24/02* (2013.01); *H01L 24/03* (2013.01); *H01L 24/05* (2013.01); *H01L 24/06* (2013.01); *H01L 24/14* (2013.01); *H01L 24/43* (2013.01); *H01L 24/46* (2013.01); *H01L 24/48* (2013.01); *H01L 24/75* (2013.01); *H01L 25/0657* (2013.01); *H01L 25/50* (2013.01); *H01L 21/568* (2013.01); *H01L 23/3128* (2013.01); *H01L 23/4952* (2013.01); *H01L 24/16* (2013.01); *H01L 24/29* (2013.01); *H01L 24/32* (2013.01); *H01L 24/81* (2013.01); *H01L 24/85* (2013.01); *H01L 24/92* (2013.01); *H01L 2224/02311* (2013.01); *H01L 2224/02321* (2013.01); *H01L 2224/0332* (2013.01); *H01L 2224/0361* (2013.01); *H01L 2224/0391* (2013.01); *H01L 2224/03515* (2013.01); *H01L 2224/04042* (2013.01); *H01L 2224/05008* (2013.01); *H01L 2224/05026* (2013.01); *H01L 2224/0529* (2013.01); *H01L 2224/05347* (2013.01); *H01L 2224/05439* (2013.01); *H01L 2224/05562* (2013.01); *H01L 2224/05567* (2013.01); *H01L 2224/05644* (2013.01); *H01L 2224/05669* (2013.01); *H01L 2224/16227* (2013.01); *H01L 2224/16235* (2013.01); *H01L 2224/2919* (2013.01); *H01L 2224/32145* (2013.01); *H01L 2224/32225* (2013.01); *H01L 2224/48091* (2013.01); *H01L 2224/48227* (2013.01); *H01L 2224/48491* (2013.01); *H01L 2224/73265* (2013.01); *H01L 2224/75283* (2013.01); *H01L 2224/75651* (2013.01); *H01L 2224/81005* (2013.01); *H01L 2224/8123* (2013.01); *H01L 2224/81815* (2013.01); *H01L 2224/83191* (2013.01); *H01L 2224/85186* (2013.01); *H01L 2224/92247* (2013.01); *H01L 2225/0651* (2013.01); *H01L 2225/06517* (2013.01); *H01L 2225/06562* (2013.01); *H01L 2225/1035* (2013.01); *H01L 2225/1058* (2013.01); *H01L 2924/00014* (2013.01); *H01L 2924/01006* (2013.01); *H01L 2924/01029* (2013.01); *H01L 2924/01047* (2013.01); *H01L 2924/01079* (2013.01); *H01L 2924/15311* (2013.01); *H01L 2924/15313* (2013.01); *H01L 2924/181* (2013.01); *H01L 2924/18162* (2013.01); *H01L 2924/18165* (2013.01)

(58) Field of Classification Search
CPC ....... H01L 24/43; H01L 24/46; H01L 21/563; H01L 25/0657; H01L 25/065; H01L 23/00
USPC ........................................................ 257/741
See application file for complete search history.

(56) References Cited

U.S. PATENT DOCUMENTS

| | | | |
|---|---|---|---|
| 6,300,687 B1* | 10/2001 | Bertin | H01L 23/49524 257/686 |
| 7,176,580 B1 | 2/2007 | Fjelstad | |
| 7,633,765 B1 | 12/2009 | Scanlan | |
| 8,026,589 B1 | 9/2011 | Kim | |
| 8,525,314 B2 | 9/2013 | Haba et al. | |
| 8,643,185 B2 | 2/2014 | Kajiwara | |
| 2004/0140549 A1 | 7/2004 | Miyagawa | |
| 2005/0214980 A1 | 9/2005 | Shiu | |
| 2006/0284299 A1* | 12/2006 | Karnezos | H01L 23/3128 257/686 |
| 2007/0216033 A1 | 9/2007 | Corisis | |
| 2007/0231953 A1 | 10/2007 | Tomita | |
| 2007/0241437 A1 | 10/2007 | Kagaya et al. | |
| 2008/0017980 A1 | 1/2008 | Scheucher | |
| 2008/0072423 A1* | 3/2008 | Finn | G06K 19/07327 29/854 |
| 2008/0283615 A1* | 11/2008 | Finn | G06K 19/077 235/488 |
| 2009/0102067 A1 | 4/2009 | Wyland | |
| 2009/0127667 A1* | 5/2009 | Iwata | H01L 21/76898 257/621 |
| 2009/0243070 A1* | 10/2009 | Ko | H01L 25/03 257/686 |
| 2010/0001398 A1* | 1/2010 | Sah | H01L 25/0652 257/723 |
| 2010/0006996 A1 | 1/2010 | Heres | |
| 2010/0032202 A1* | 2/2010 | Higashitani | H05K 3/384 174/264 |
| 2010/0078824 A1 | 4/2010 | Okamori | |
| 2010/0129964 A1 | 5/2010 | Goh | |
| 2010/0304048 A1* | 12/2010 | Yukinobu | C08J 7/045 428/1.1 |
| 2011/0068481 A1 | 3/2011 | Park | |
| 2011/0281138 A1 | 11/2011 | Yoshioka | |
| 2012/0091597 A1* | 4/2012 | Kwon | H01L 23/49838 257/777 |
| 2012/0228768 A1 | 9/2012 | Pagaila | |
| 2013/0001761 A1 | 1/2013 | Rogren | |
| 2013/0032952 A1 | 2/2013 | Cho | |
| 2013/0213456 A1* | 8/2013 | Schlemper | H01L 31/048 136/251 |
| 2014/0070391 A1 | 3/2014 | Rogren | |
| 2014/0225222 A1* | 8/2014 | Yu | H01L 27/1255 257/532 |
| 2014/0319567 A1 | 10/2014 | Yoneda | |
| 2015/0348895 A1 | 12/2015 | Sen | |
| 2015/0364420 A1* | 12/2015 | Lin | H01L 23/5283 257/775 |
| 2016/0007444 A1* | 1/2016 | Watanabe | H05K 1/0215 174/254 |
| 2016/0064344 A1 | 3/2016 | Yajima | |
| 2016/0086921 A1* | 3/2016 | Cho | H01L 25/0657 257/737 |
| 2016/0157343 A1* | 6/2016 | Abe | H05K 1/0283 361/749 |
| 2016/0276561 A1* | 9/2016 | Maki | H01L 33/62 |
| 2016/0336303 A1 | 11/2016 | Tsai | |
| 2017/0025390 A1* | 1/2017 | Haba | H01L 21/4846 |
| 2017/0077035 A1 | 3/2017 | Tao | |
| 2018/0053702 A1 | 2/2018 | Spory | |
| 2018/0090037 A1* | 3/2018 | Tso | H05K 3/4685 |
| 2018/0122764 A1 | 5/2018 | Chen et al. | |
| 2018/0134920 A1* | 5/2018 | Takami | B32B 15/08 |
| 2018/0138150 A1* | 5/2018 | Eom, II | H01L 25/0657 |
| 2018/0145036 A1* | 5/2018 | Kim | H01L 24/20 |

(56) References Cited

U.S. PATENT DOCUMENTS

FOREIGN PATENT DOCUMENTS

| | | | | |
|---|---|---|---|---|
| CN | 205303447 | U | 6/2016 | |
| EP | 3346492 | A3 | 8/2018 | |
| JP | H02-52443 | A | 2/1990 | |
| JP | H05299530 | A | 11/1993 | |
| JP | H08-107123 | A | 4/1996 | |
| JP | 2001230270 | A | 8/2001 | |
| JP | 2007123595 | A | 5/2007 | |
| JP | 2011-77460 | A * | 4/2011 | ........... H01L 21/288 |
| KR | 10-2010-0124161 | A | 11/2010 | |
| KR | 10-2014-0064053 | A | 5/2014 | |
| TW | 481901 | * | 4/2002 | |
| TW | 2007-42015 | A | 11/2007 | |
| TW | 2008-14213 | A | 3/2008 | |
| TW | 2008-28564 | A | 7/2008 | |
| TW | 2008-34857 | A | 8/2008 | |
| TW | 201133655 | A1 | 10/2011 | |
| TW | 2015-37716 | A | 10/2015 | |
| TW | 201541623 | A | 11/2015 | |
| TW | 201620106 | A | 6/2016 | |
| TW | 2016-28110 | A | 8/2016 | |
| TW | 2016-40626 | A | 11/2016 | |
| TW | 201639100 | A | 11/2016 | |
| TW | 201639103 | A | 11/2016 | |
| TW | 201642426 | A | 12/2016 | |

\* cited by examiner

SEMICONDUCTOR CHIP PACKAGE WITH RESILIENT CONDUCTIVE PASTE POST AND FABRICATION METHOD THEREOF

CROSS REFERENCE TO RELATED APPLICATION

This application is a continuation-in-part of U.S. application Ser. No. 15/063,433 filed Mar. 7, 2016, now U.S. Pat. No. 9,842,831, which itself claims the priority from U.S. provisional application No. 62/161,591 filed May 14, 2015 and U.S. provisional application No. 62/190,401 filed Jul. 9, 2015. This application also claims the priority from U.S. provisional application No. 62/442,473 filed Jan. 5, 2017 and U.S. provisional application No. 62/445,278 filed Jan. 12, 2017. All of the above-mentioned applications are included in their entirety herein by reference.

BACKGROUND

The present invention relates to interconnects of integrated circuits and semiconductor chip packages.

An integrated circuit (IC) die is a small device formed on a semiconductor wafer, such as a silicon wafer. Such a die is typically cut from the wafer and attached to a substrate for interconnect redistribution. Bond pads on the die are then electrically connected to the leads on the carrier via wire bonding. The die and the bonding wires are then encapsulated with a molding compound such that a package is formed.

Typically, the leads encapsulated in the package are redistributed in a network of conductors within the carrier and end in an array of terminal points outside the package. Manufacturers have been stacking two or more die within a single package. Such devices are sometimes referred to as stacked multichip packages.

One stacked multichip package is generally illustrated in FIG. 1. In this configuration a first die 11 is mounted on a substrate 10. A second die 12 may then be adhesively secured to the top surface of the first die 11 thereby creating a stacked die configuration. The second die 12 partially overlaps with the first die 11 when viewed from the above. Bonding wires 16 and 18 are then used to electrically connect the first die 11 and the second die 12 to the respective bond fingers on the substrate 10 using conventional wire bonder. An encapsulant material 20 is molded over the substrate 10 to provide an encapsulant cap.

As known in the art, a stand-off stitch bonding process typically comprises placing a flat-topped bump on an active integrated circuit (IC) pad such as an aluminum pad, and then reverse bonding from the substrate or package back to the flat-topped ball bump. However, it is difficult to form the wire bond 18 on the bond pads of the second die 12 adjacent to the overhanging side edge 12a. The stress incurred by the wire bonder may cause peeling between the first die 11 and the second die 12 and reduce the production yield.

SUMMARY

It is one objective of the claimed invention to provide an improved semiconductor chip package and a fabrication method thereof in order to solve the above-mentioned prior art problems.

According to one aspect of the invention, a semiconductor chip package includes a substrate; a semiconductor die mounted on the substrate, wherein the semiconductor die comprises a bond pad disposed on an active surface of the semiconductor die, and a passivation layer covering perimeter of the bond pad, wherein a bond pad opening in the passivation layer exposes a central area of the bond pad; a conductive paste post printed on the exposed central area of the bond pad; and a bonding wire secured to a top surface of the conductive paste post. The conductive paste post comprises copper paste.

According to another aspect of the invention, a semiconductor chip package includes a substrate; a semiconductor die mounted on the substrate, wherein the semiconductor die comprises a bond pad disposed on an active surface of the semiconductor die, and a passivation layer covering perimeter of the bond pad, wherein a bond pad opening in the passivation layer exposes a central area of the bond pad; a conductive paste post printed on the exposed central area of the bond pad; a conductive trace printed on the passivation layer and being electrically connected to the conductive paste post; a redistributed bond pad printed on the passivation layer, wherein the redistributed bond pad is electrically connected to the conductive paste post through the conductive trace; and a bonding wire secured to a top surface of the redistributed bond pad.

According to still another aspect of the invention, a method for forming a substrate is disclosed. A carrier is provided. A solder mask is coated on the carrier. The solder mask is patterned, thereby forming a plurality of openings in the solder mask. A first conductive paste is printed into the openings, thereby forming a first circuit layer. A dielectric layer is coated on the first circuit layer. The dielectric layer is patterned, thereby forming via openings in the dielectric layer. A second conductive paste is printed into the via openings and on the dielectric layer, thereby forming a second circuit layer.

According to still another aspect of the invention, a package-on-package is disclosed. The package-on-package includes a bottom package comprising a first semiconductor die mounted on a substrate, and a plurality of solder balls mounted on a lower surface of the substrate. The first semiconductor die is encapsulated by a first molding compound. Conductive traces are printed on the first molding compound. A second semiconductor die is mounted on the first molding compound.

According to still another aspect of the invention, a semiconductor chip package includes a semiconductor die mounted on a substrate; a plurality of solder balls mounted on a lower surface of the substrate; a molding compound encapsulating the semiconductor die; and a plurality of heat-dissipating features embedded in the top surface of the molding compound. The heat-dissipating features are composed of conductive paste.

According to still another aspect of the invention, a substrate includes a plurality of conductive traces is formed on a top surface of the substrate; a solder mask covering the plurality of conductive traces; a bonding finger disposed outbound of the solder mask; a solder mask opening in the solder mask to expose a via in the substrate; and a conductive trace printed over the solder mask to electrically connect the bonding finger to the via.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

Figure 2:
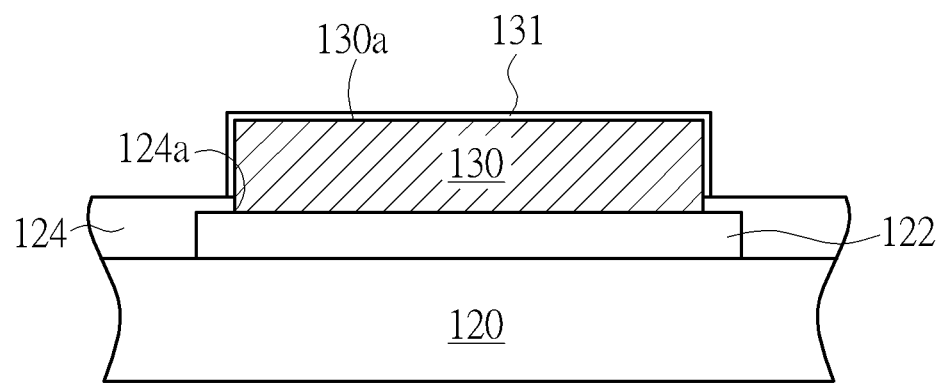
FIG. 2 to FIG. 4 are schematic, cross-sectional diagrams showing a conductive paste post on a bond pad for stand-off stitch bonding process in accordance with one embodiment of the invention.
Figure 3:
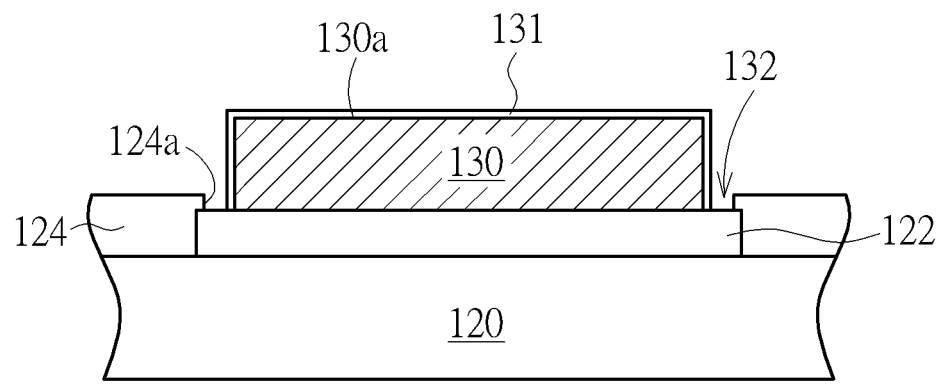
Figure 4:
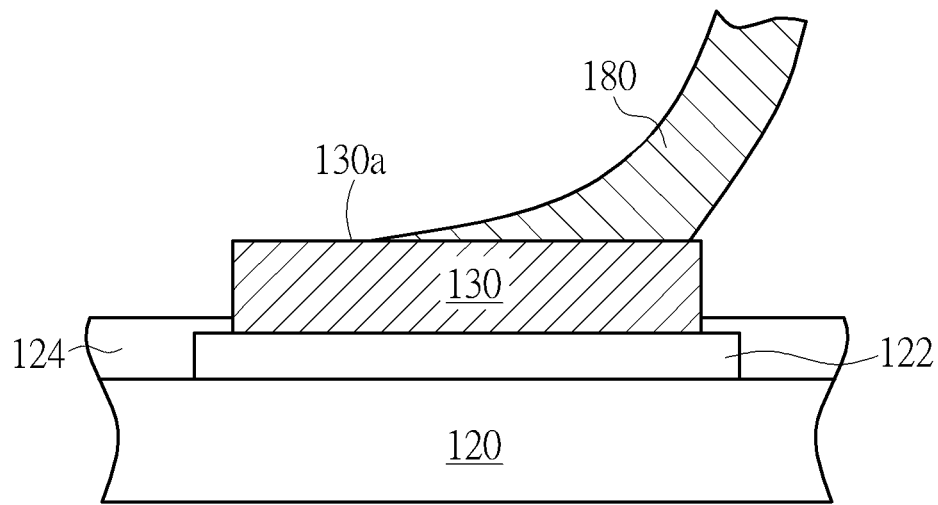

Please refer to FIG. 2 to FIG. 4. FIG. 2 to FIG. 4 are schematic, cross-sectional diagrams showing a conductive paste post on a bond pad for stand-off stitch bonding process in accordance with one embodiment of the invention. As shown in FIG. 2 and FIG. 3, a semiconductor die 120 having a bond pad 122 formed thereon is provided. Although only one bond pad 122 is illustrated in this figure, it is understood that the semiconductor die 120 may comprise a plurality of bond pads distributed on the active surface of the semiconductor die 120. For example, the bond pad 122 may be an aluminum bond pad.

According to one embodiment of the invention, a passivation layer 124 such as a polyimide layer may be formed on the semiconductor die 120 and cover the perimeter of the bond pad 122. According to one embodiment of the invention, the bond pad opening 124a exposes a central area of the bond pad 122.

According to one embodiment of the invention, a conductive paste post 130 is printed on the exposed central area of the bond pad 122. For example, the conductive paste post 130 may comprise copper paste, but is not limited thereto. According to one embodiment of the invention, the conductive paste post 130 may be formed by using screen-printing processes. According to one embodiment of the invention, the conductive paste post 130 may be formed by using 3D printing processes. The conductive paste post 130 functions as a buffer to prevent aluminum extrusion.

Compared to the conventional flat-topped ball bump formed during a conventional stand-off stitch bonding process, the conductive paste post 130 has a flatter top surface 130a. The flatter top surface 130a of the conductive paste post 130 provides higher reliability and better performance of the package devices.

According to one embodiment of the invention, for example, the copper paste may comprise epoxy resin such as a thermosetting epoxy resin, and copper powder or silver-coated copper balls as filler, but is not limited thereto. After printing the conductive paste post 130 on the bond pad 122, the conductive paste post 130 may be subjected to a curing process. According to one embodiment of the invention, the conductive paste post 130 may be cured by thermal processes or ultraviolet (UV) light.

Optionally, the top surface 130a of the conductive paste post 130 may be subjected to an etching process to expose more metal filler, thereby reducing the contact resistance. According to anther embodiment of the invention, a conductive layer 131 having low resistance, for example, Pt or Au, may be coated on the top surface 130a of the conductive paste post 130.

The conductive paste post 130 may completely fill up the bond pad opening 124a, as shown in FIG. 2. In FIG. 2, the peripheral sidewall of the conductive paste post 130 is in direct contact with the passivation layer 124. Alternatively, the conductive paste post 130 does not completely fill up the bond pad opening 124a, as shown in FIG. 3. In FIG. 3, the peripheral sidewall of the conductive paste post 130 is not in direct contact with the passivation layer 124. A gap 132 may be formed between the peripheral sidewall of the conductive paste post 130 and the passivation layer 124.

Figure 1:
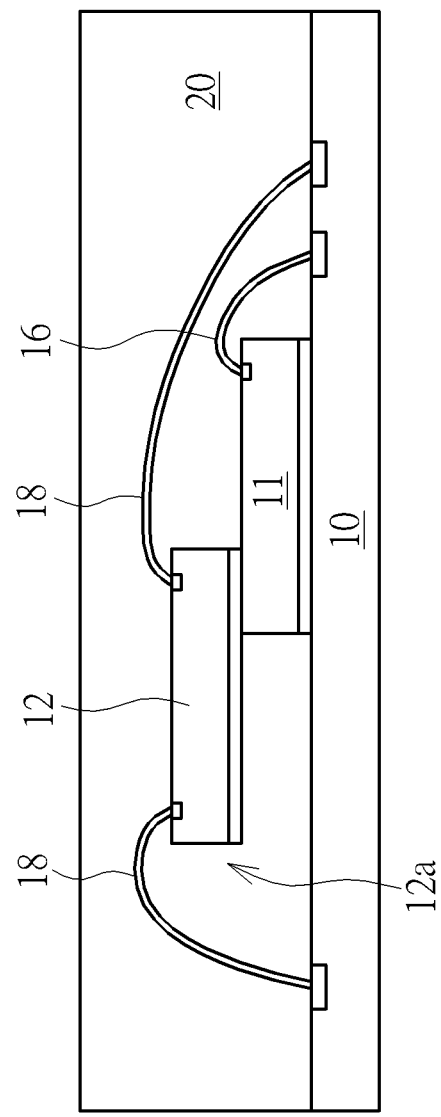
FIG. 1 is a schematic, cross-sectional diagram showing a conventional stacked multichip package.

FIG. 4 shows the conductive paste post 130 after a bonding wire is bonded thereon. As shown in FIG. 4, a wire bonding process such as a stand-off stitch bonding process may be performed to secure a bonding wire 180 on the top surface 130a of the conductive paste post 130. According to one embodiment of the invention, the conductive paste post 130 replaces the conventional flat-topped ball bump formed during a conventional stand-off stitch bonding process. Further, the conductive paste post 130 may be printed on the semiconductor die 120 prior to the wire bonding process. Therefore, the stress exerted on the overhanging side edge of the top die as depicted in FIG. 1 may be reduced or avoided. The throughput (UPH or unit per hour) of the wire bonding process is also improved.

Because of the resilient property of the conductive paste post 130, the conductive paste post 130 quickly recovers its shape after the bonding wire 180 is formed. The shorting between the adjacent bond pads may be avoided. Therefore, smaller bond pad opening and bond pad pitch may be employed.

Figure 5:
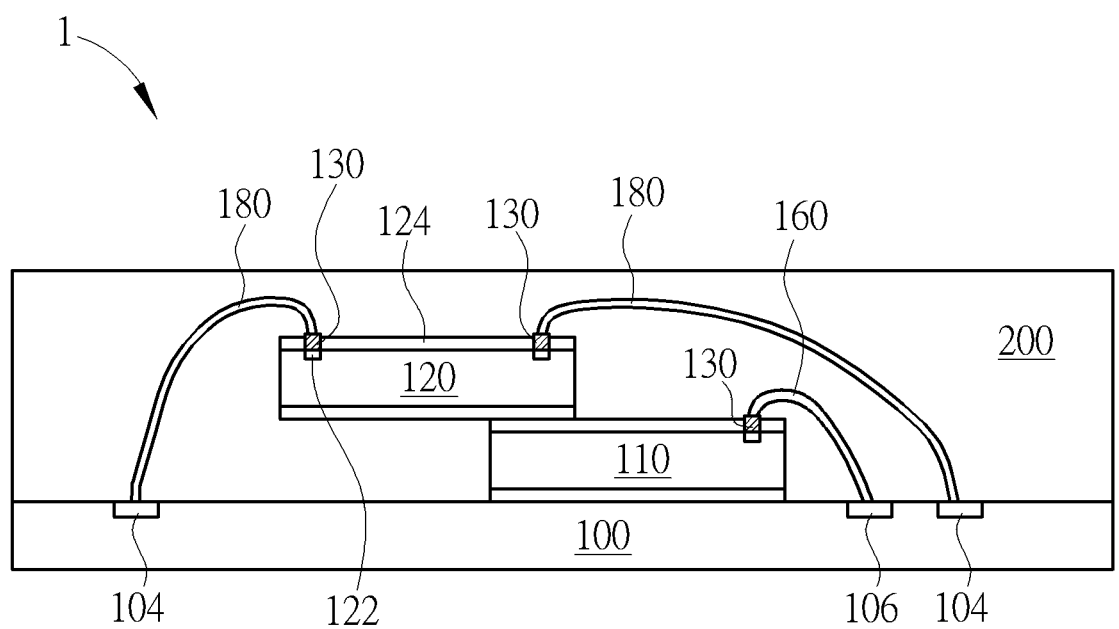
FIG. 5 and FIG. 6 show exemplary semiconductor chip packages incorporating the conductive paste post as depicted in FIG. 4.

FIG. 5 shows an exemplary semiconductor chip package 1 incorporating the conductive paste post as depicted in FIG.

4, wherein like numeral numbers designate like elements, regions, or layers. As shown in FIG. 5, the semiconductor chip package 1 comprises a second die 120 mounted on a first die 110. The second die 120 is adhesively secured to the top surface of the first die 110 thereby creating a stacked die configuration. The second die 120 partially overlaps with the first die 110 when viewed from the above. An encapsulant material 200 such as an epoxy molding compound is molded over the substrate 100 to provide an encapsulant cap.

Bonding wires 160 and 180 are formed to electrically connect the first die 110 and the second die 120 to the respective bond fingers 104 and 106 on the substrate 100 using a wire bonder. The substrate 100 may be a package substrate, but is not limited thereto. The bonding wire 180 may be secured to the bond finger 104 on the substrate 100 and then reverse bonded to the conductive paste post 130 on the second die 120.

Figure 6:
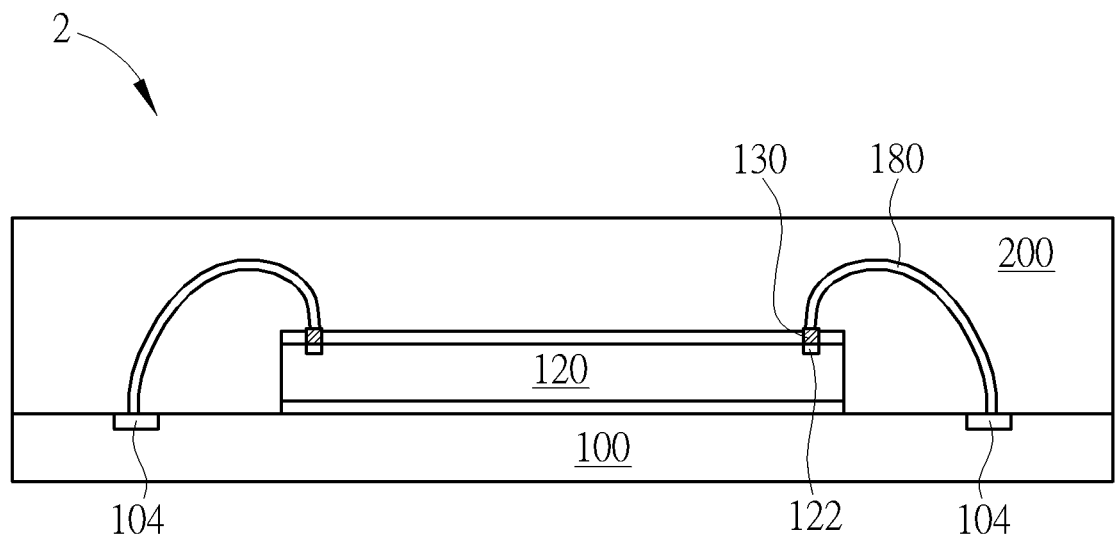

FIG. 6 shows an exemplary semiconductor chip package 2 incorporating the conductive paste post as depicted in FIG. 4, wherein like numeral numbers designate like elements, regions, or layers. As shown in FIG. 6, the semiconductor chip package 2 comprises a single die 120 mounted on the substrate 100. Bonding wires 180 are formed to electrically connect the die 120 to the respective bond fingers 104 on the substrate 100 using a wire bonder. The substrate 100 may be a package substrate, but is not limited thereto. The bonding wire 180 may be secured to the bond finger 104 on the substrate 100 and then reverse bonded to the conductive paste post 130 on the die 120.

It is understood that the package structures shown in FIG. 5 and FIG. 6 are for illustration purposes only. Other package structures may be employed without departing from the spirit or scope of the present invention.

Please refer to FIG. 7 to FIG. 10. FIG. 7 to FIG. 10 are schematic, cross-sectional diagrams showing various embodiments in accordance with the present invention, wherein like numeral numbers designate like elements, regions, or layers. The redistribution layer (RDL) structures shown in FIG. 7 to FIG. 10 may be applicable to the semiconductor chip packages as set forth in FIG. 5 and FIG. 6.

Figure 7:
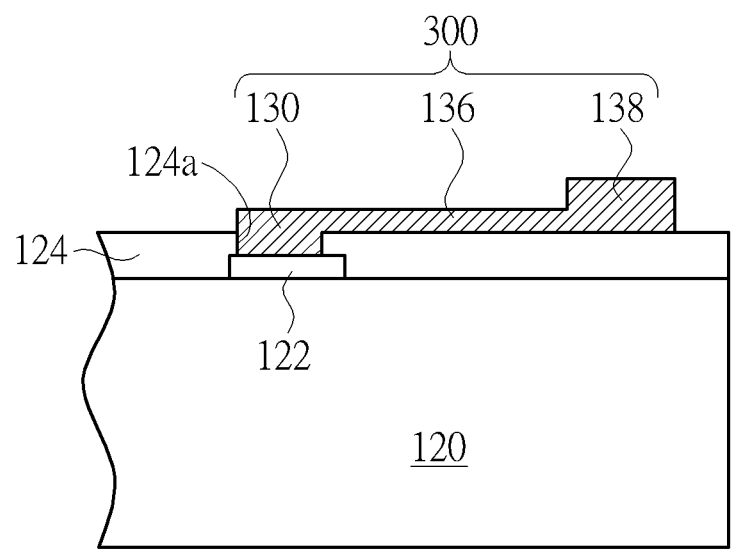
FIG. 7 to FIG. 10 are schematic, cross-sectional diagrams showing various embodiments in accordance with the present invention.

As shown in FIG. 7, likewise, a semiconductor die 120 having a bond pad 122 formed thereon is provided. Although only one bond pad 122 is illustrated in this figure, it is understood that the semiconductor die 120 may comprise a plurality of bond pads distributed on the active surface of the semiconductor die 120. For example, the bond pad 122 may be an aluminum bond pad.

According to one embodiment of the invention, a passivation layer 124 such as a polyimide layer may be formed on the semiconductor die 120 and cover the perimeter of the bond pad 122. According to one embodiment of the invention, the bond pad opening 124a exposes a central area of the bond pad 122.

According to one embodiment of the invention, a conductive paste post 130 is printed on the exposed central area of the bond pad 122. For example, the conductive paste post 130 may comprise copper paste, but is not limited thereto. According to one embodiment of the invention, the conductive paste post 130 may be formed by using screen-printing processes. According to one embodiment of the invention, the conductive paste post 130 may be formed by using 3D printing processes.

According to one embodiment of the invention, a conductive trace 136 is printed on the passivation layer 124. The conductive trace 136 is electrically connected to the conductive paste post 130. The conductive trace 136 may comprise copper paste, but is not limited thereto. According to one embodiment of the invention, the conductive paste post 130 and the conductive trace 136 may be printed by using the same printing process.

According to one embodiment of the invention, a redistributed bond pad 138 is also printed on the passivation layer 124. The redistributed bond pad 138 is electrically connected to the conductive paste post 130 through the conductive trace 136. The redistributed bond pad 138 is thicker than the conductive trace 136.

The conductive paste post 130, the conductive trace 136, and the redistributed bond pad 138 may be printed by using the same printing process, and may be subjected to a curing process. The conductive paste post 130 is structurally integral with the conductive trace 136 and the redistributed bond pad 138. The conductive paste post 130, the conductive trace 136, and the redistributed bond pad 138 constitute a redistribution layer structure 300.

Figure 8:
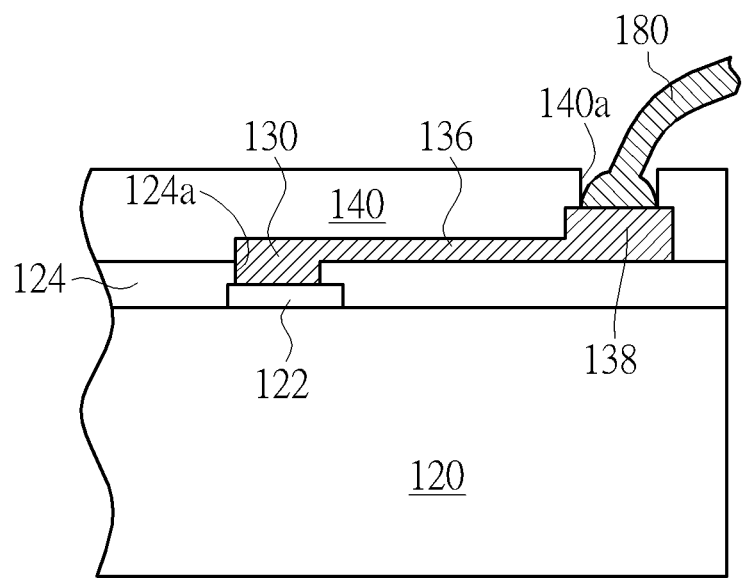

As shown in FIG. 8, a semiconductor die 120 having a bond pad 122 formed thereon is provided. Although only one bond pad 122 is illustrated in this figure, it is understood that the semiconductor die 120 may comprise a plurality of bond pads distributed on the active surface of the semiconductor die 120. For example, the bond pad 122 may be an aluminum bond pad.

According to one embodiment of the invention, a passivation layer 124 such as a polyimide layer may be formed on the semiconductor die 120 and cover the perimeter of the bond pad 122. According to one embodiment of the invention, the bond pad opening 124a exposes a central area of the bond pad 122.

Likewise, a conductive paste post 130, a conductive trace 136, and a redistributed bond pad 138 are printed onto the semiconductor die 120 as described in FIG. 7. An insulating layer 140 may be formed on the semiconductor die 120. According to one embodiment of the invention, the insulating layer 140 may comprise a molding compound, but is not limited thereto. The insulating layer 140 covers the conductive paste post 130, the conductive trace 136, and the redistributed bond pad 138. An opening 140a may be formed in the insulating layer 140 to partially expose the redistributed bond pad 138. A bonding wire 180 may be secured to the exposed redistributed bond pad 138.

Figure 9:
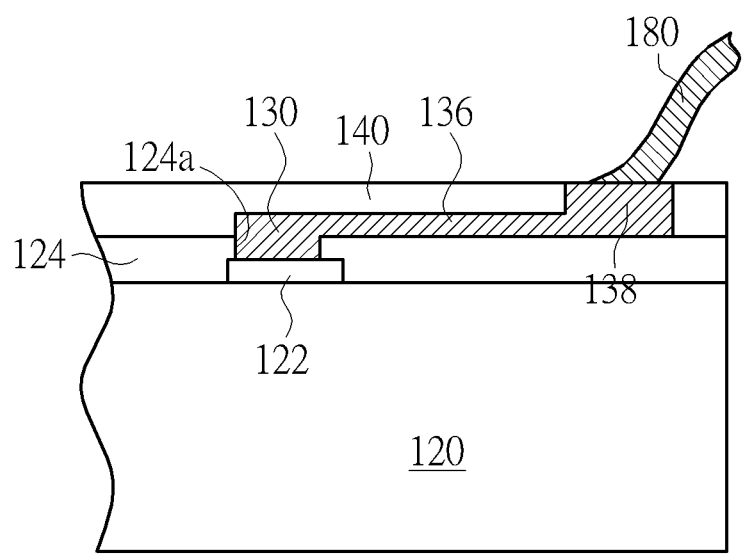

As shown in FIG. 9, a semiconductor die 120 having a bond pad 122 formed thereon is provided. Although only one bond pad 122 is illustrated in this figure, it is understood that the semiconductor die 120 may comprise a plurality of bond pads distributed on the active surface of the semiconductor die 120. For example, the bond pad 122 may be an aluminum bond pad.

According to one embodiment of the invention, a passivation layer 124 such as a polyimide layer may be formed on the semiconductor die 120 and cover the perimeter of the bond pad 122. According to one embodiment of the invention, the bond pad opening 124a exposes a central area of the bond pad 122.

A conductive paste post 130, a conductive trace 136, and a redistributed bond pad 138 are printed onto the semiconductor die 120 as described in FIG. 7. An insulating layer 140 may be formed on the semiconductor die 120. According to one embodiment of the invention, the insulating layer 140 may comprise a molding compound, but is not limited thereto. The insulating layer 140 covers the conductive paste post 130, the conductive trace 136, and the redistributed bond pad 138. The insulating layer 140 is subjected to a polishing process to expose the redistributed bond pad 138. A bonding wire 180 may be secured to the exposed redistributed bond pad 138.

Figure 10:
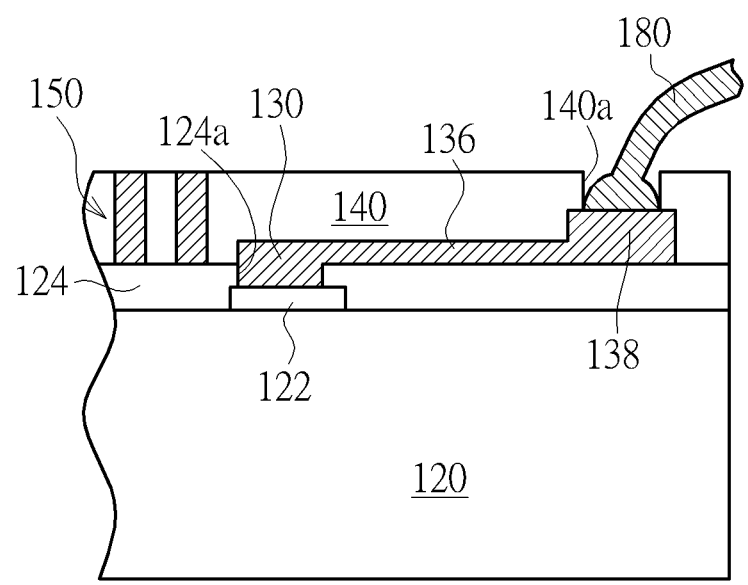

As shown in FIG. 10, the difference between the structure of FIG. 10 and the structure 2 of FIG. 8 is that the structure of FIG. 10 further comprises a printed passive element 150 on the passivation layer 124. According to one embodiment of the invention, the passive element 150 may comprise copper paste as the composition used to form the conductive paste post 130, the conductive trace 136, and the redistributed bond pad 138. According to one embodiment of the invention, the passive element 150 may be a resistor, a capacitor, or an inductor, but is not limited thereto.

Please refer to FIG. 11 to FIG. 14. FIG. 11 to FIG. 14 are schematic, cross-sectional diagrams showing a method for forming a substrate 400 in accordance with one embodiment of the invention. The substrate 400 may be an interposer substrate, a package substrate, or a circuit board.

Figure 11:
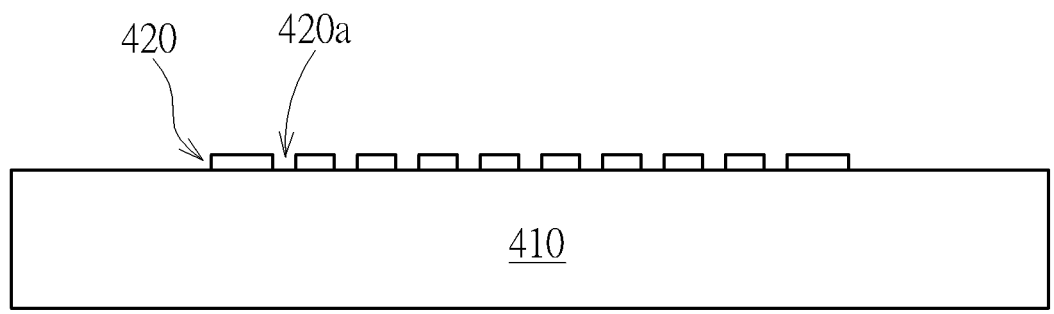
FIG. 11 to FIG. 14 are schematic, cross-sectional diagrams showing a method for forming a substrate in accordance with one embodiment of the invention.

As shown in FIG. 11, a layer of solder mask 420 is coated on a carrier 410. Subsequently, the solder mask 420 may be patterned by using a lithographic process, thereby forming a plurality of openings 420a. According to one embodiment of the invention, the carrier 410 may be a plastic substrate or a flexible substrate, but is not limited thereto.

Figure 12:
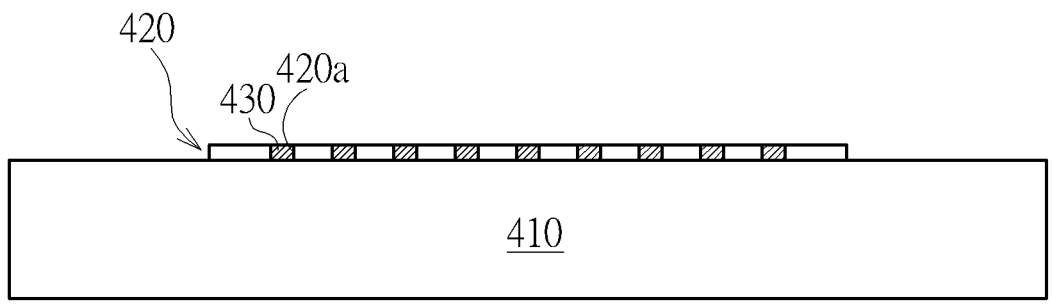

As shown in FIG. 12, a printing process is performed to print a conductive paste such as copper paste into the openings 420a, thereby forming a first circuit layer 430. According to one embodiment of the invention, for example, the first circuit layer 430 may comprise ball grid array (BGA) ball pads and interconnect traces. According to one embodiment of the invention, the printing process may comprise screen-printing process, but is not limited thereto. The first circuit layer 430 may be subjected to a curing process.

Figure 13:
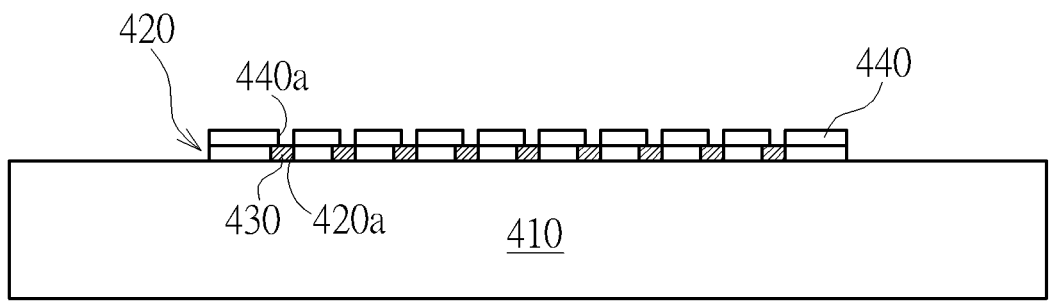

As shown in FIG. 13, a dielectric layer 440 is then coated on the first circuit layer 430. According to one embodiment of the invention, the dielectric layer 440 may comprise polyimide, ABF (Ajinomoto Buildup Film) or the like, but is not limited thereto. A lithographic process may be performed to pattern the dielectric layer 440, thereby forming via openings 440a in the dielectric layer 440. The via openings 440a partially expose the first circuit layer 430 respectively.

Figure 14:
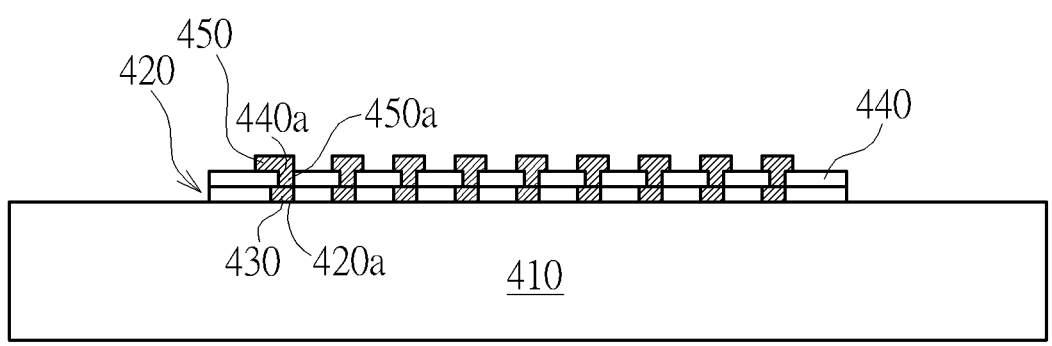

As shown in FIG. 14, a printing process is performed to print a conductive paste such as copper paste into the via openings 440a and on the dielectric layer 440, thereby forming a second circuit layer 450. The second circuit layer 450 comprises via elements 450a for electrically connecting the second circuit layer 450 to the first circuit layer 430. It is understood that the steps as depicted through FIG. 11 to FIG. 14 may be repeated to form a desired number of interconnect layers in the interposer substrate.

Figure 15:
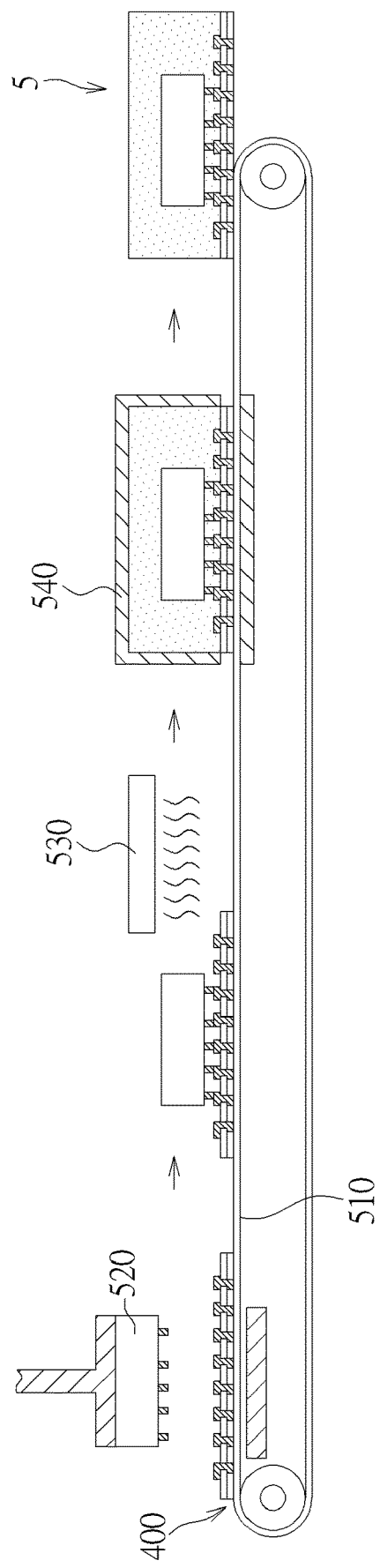
FIG. 15 is a schematic diagram showing a tape automated bonding (TAB) method for fabricating a semiconductor chip package in accordance with one embodiment of the invention.
Figure 16:
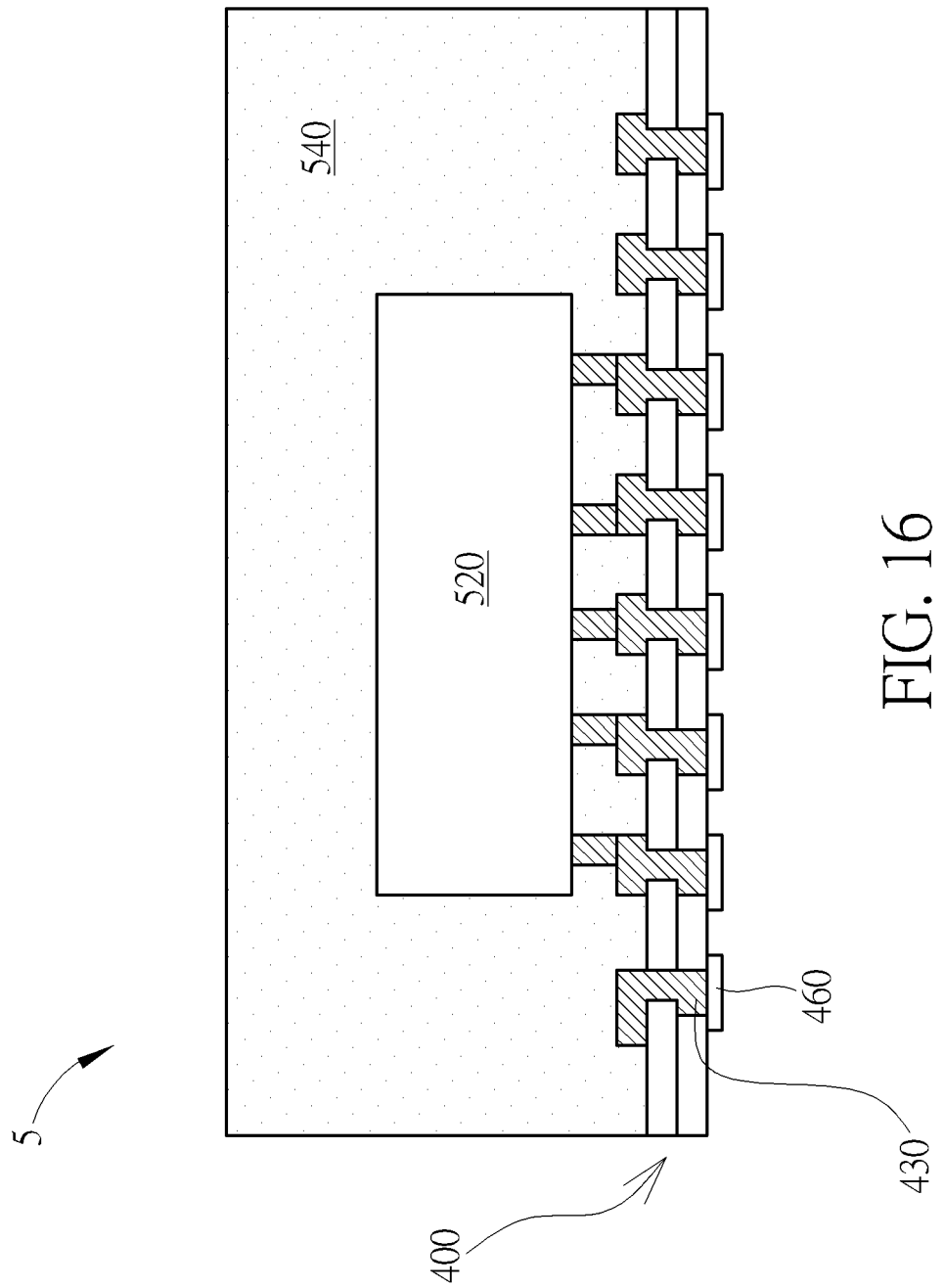
FIG. 16 is a schematic diagram showing the processing of the semiconductor chip package fabricated in FIG. 15.

Please refer to FIG. 15. FIG. 15 is a schematic diagram showing a tape automated bonding (TAB) method for fabricating a semiconductor chip package in accordance with one embodiment of the invention. FIG. 16 is a schematic diagram showing the processing of the semiconductor chip package fabricated in FIG. 15.

As shown in FIG. 15, the substrate 400 such as an interposer substrate or a package substrate may be prefabricated on the TAB tape 510, for example, by the steps depicted through FIG. 11 to FIG. 14. The TAB tape 510 may be composed of polyimide, but is not limited thereto. At the first station, a flip chip 520 such as a solder bumped chip or die may be bonded on the substrate 400.

After the chip placement and bonding, the chip assembly is then subjected to a curing and solder reflow process at the second station to cure the copper paste of the substrate 400 and reflow the solder joints between the flip chip 520 and the substrate 400. For example, an infrared (IR) reflow device 530 may be used during the curing process, but is not limited thereto.

Thereafter, a molding process is performed at the third station. A molding compound 540 is applied. The molding compound 540 covers the attached flip chip 520 and the and the top surface of the substrate 400. The molding compound 540 may be subjected to a curing process. The molding compound 540 may comprise a mixture of epoxy and silica fillers, but not limited thereto. After the molding process, the semiconductor chip package 5 is detached from the TAB tape 510.

As shown in FIG. 16, after the detachment of the semiconductor chip package 5 from the TAB tape 510, the exposed lower surfaces (ball pads) of the first circuit layer 430 may be covered with a surface finish layer 460 such as a Ni/Au layer or a ASOP layer. Subsequently, connection elements such as ball grid array (BGA) balls (not shown) may be formed on the ball pads.

FIG. 17 to FIG. 20 are schematic diagrams showing methods for forming package-on-package (PoP) according to various embodiments of the invention, wherein like numeral numbers designate like elements, regions, or layers.

Figure 17:
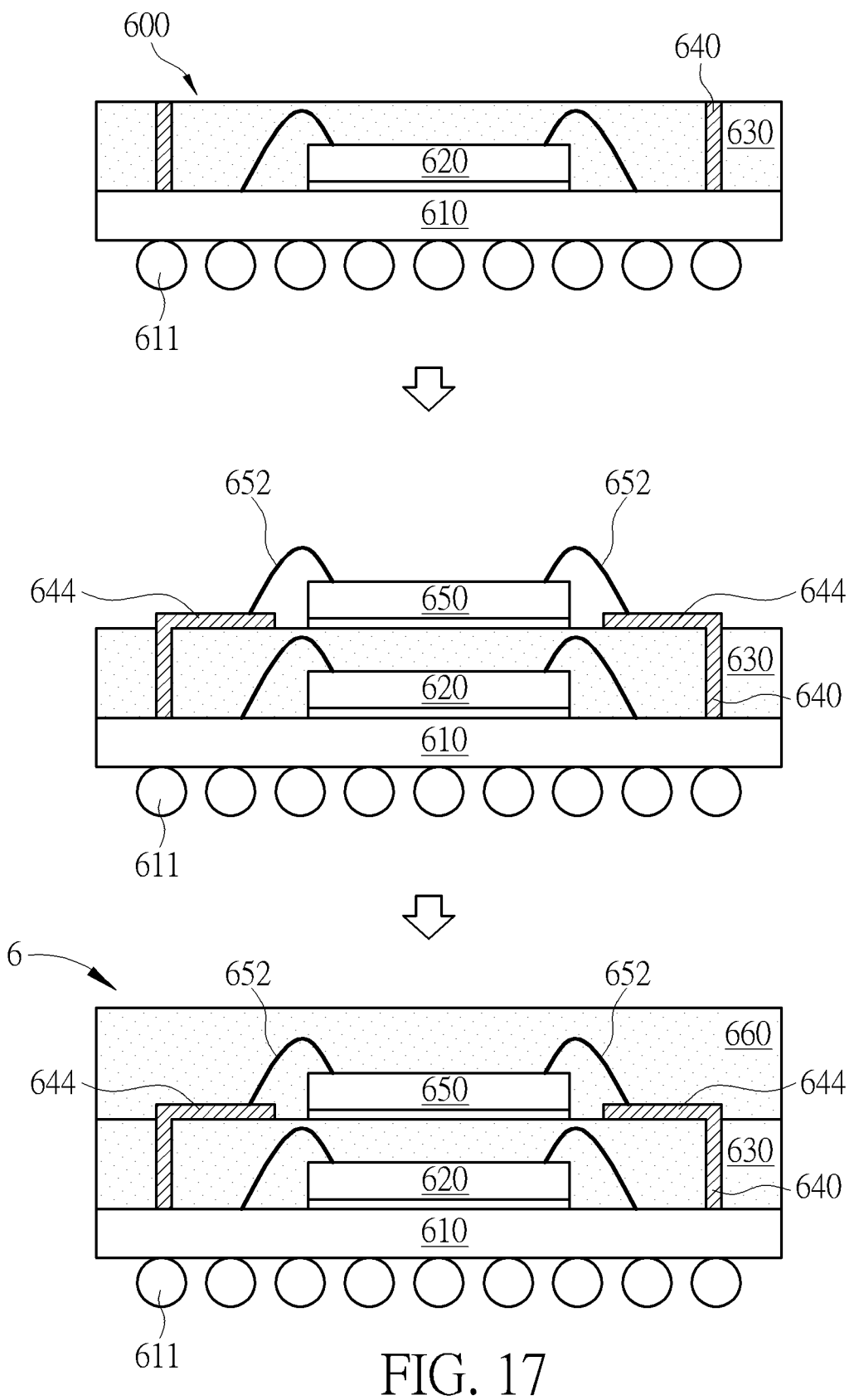
FIG. 17 to FIG. 20 are schematic diagrams showing methods for forming package-on-package (PoP) according to various embodiments of the invention.

As shown in FIG. 17, a bottom package 600 is provided. The bottom package 600 comprises a first semiconductor die 620 mounted on a substrate 610. A plurality of solder balls 611 may be mounted on a lower surface of the substrate 610. The first semiconductor die 620 may be encapsulated by a first molding compound 630. Through mold vias 640 may be provided in the first molding compound 630.

Although the first semiconductor die 620 is electrically connected to the substrate 610 through bonding wires in the figures, it is understood that the semiconductor die 620 may be a flip chip in other embodiments.

Subsequently, a printing process such as a screen printing process or a 3D printing process may be performed to print conductive traces 644 such as bonding fingers on the first molding compound 630. The printed conductive traces 644 are electrically connected to the through mold vias 640, respectively. After the printing process, the printed conductive traces 644 may be subjected to a curing process. Optionally, a conductive layer such as Pt, Ag, or the like may be provided on the printed conductive traces 644.

A second semiconductor die 650 is then mounted on the first molding compound 630. Bonding wires 652 are formed to electrically connect the second semiconductor die 650 to the conductive traces 644. Subsequently, the second semiconductor die 650 may be encapsulated by a second molding compound 660, thereby forming a package-on-package 6.

Figure 18:
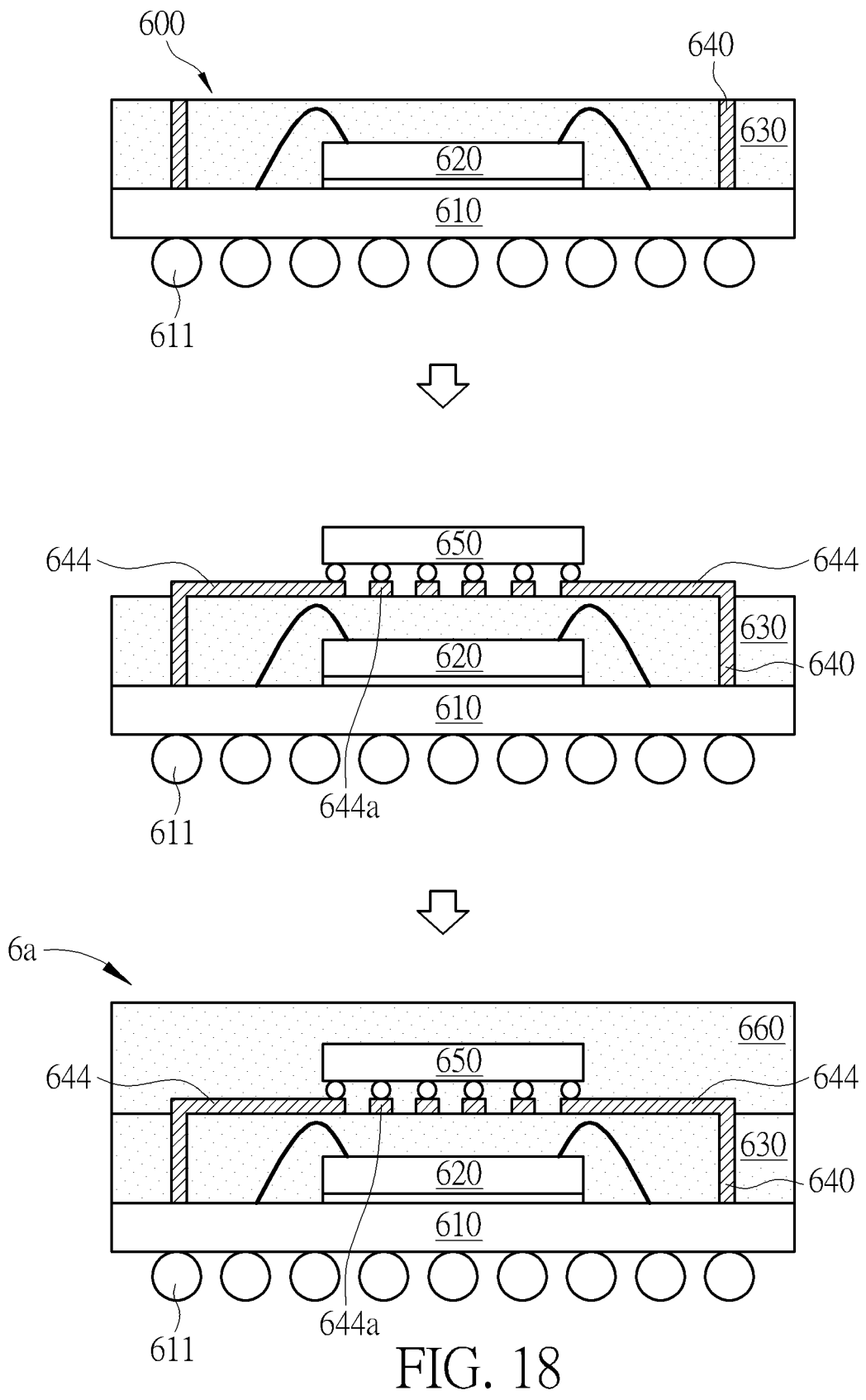

As shown in FIG. 18, likewise, a bottom package 600 is provided. The bottom package 600 comprises a first semiconductor die 620 mounted on a substrate 610. A plurality of solder balls 611 may be mounted on a lower surface of the substrate 610. The first semiconductor die 620 may be encapsulated by a first molding compound 630. Through mold vias 640 may be provided in the first molding compound 630.

Although the first semiconductor die 620 is electrically connected to the substrate 610 through bonding wires in this figure, it is understood that the first semiconductor die 620 may be a flip chip in other embodiments.

Subsequently, a printing process such as a screen printing process or a 3D printing process may be performed to print conductive traces 644 including bond pads 644a on the first molding compound 630. The printed conductive traces 644 are electrically connected to the through mold vias 640, respectively. After the printing process, the printed conductive traces 644 may be subjected to a curing process. Optionally, a conductive layer such as Pt, Ag, or the like may be provided on the printed conductive traces 644.

A second semiconductor die 650 is then bonded on the bond pads 644a in a flip chip configuration. Subsequently, the second semiconductor die 650 may be encapsulated by a second molding compound 660, thereby forming a package-on-package 6a.

Figure 19:
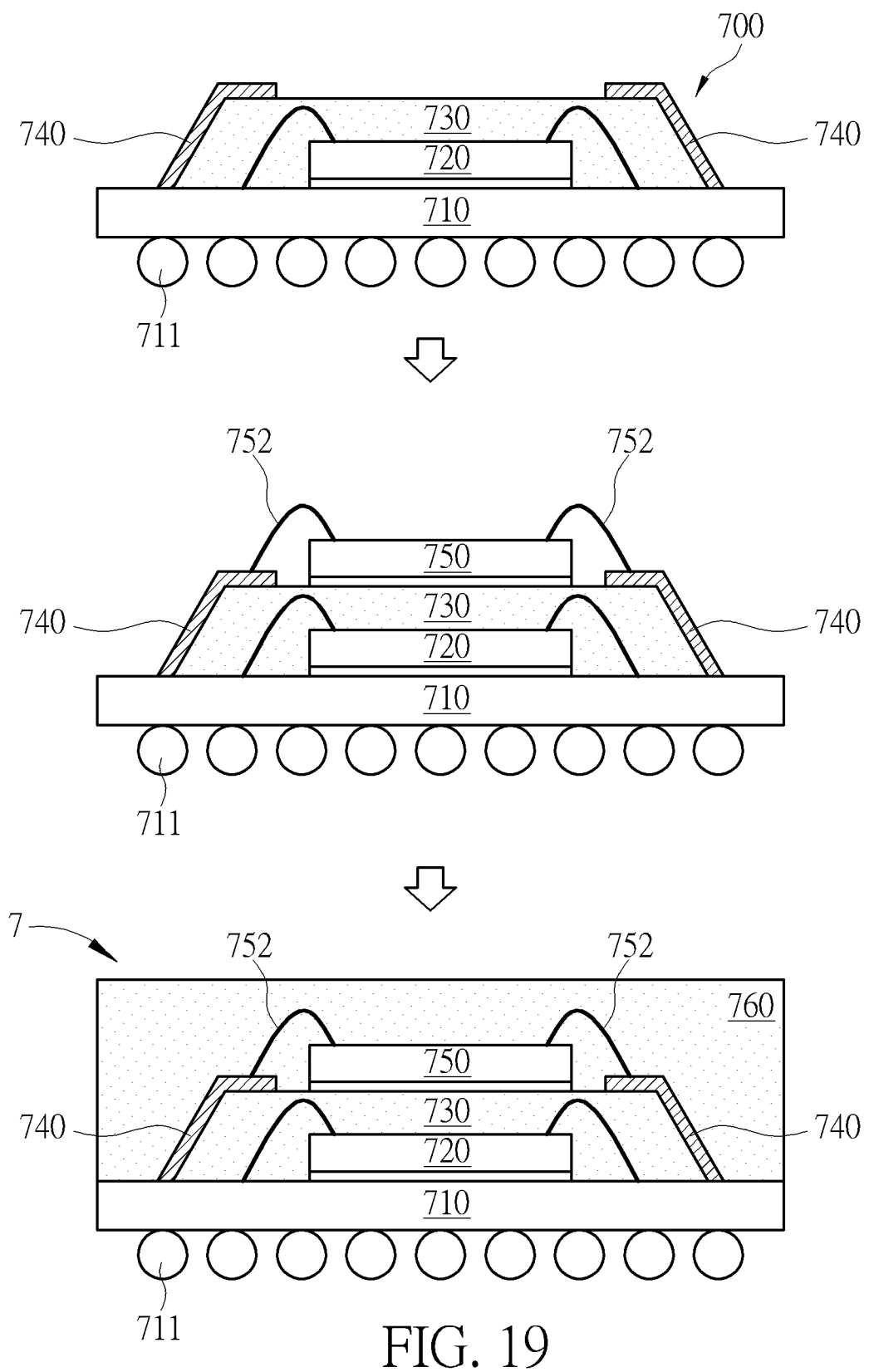

As shown in FIG. 19, a bottom package 700 is provided. The bottom package 700 comprises a first semiconductor die 720 mounted on a substrate 710. A plurality of solder balls 711 may be mounted on a lower surface of the substrate 710. The first semiconductor die 720 may be encapsulated by a first molding compound 730.

Although the first semiconductor die 720 is electrically connected to the substrate 710 through bonding wires in this figure, it is understood that the first semiconductor die 720 may be a flip chip in other embodiments.

Subsequently, a printing process such as a screen printing process or a 3D printing process may be performed to print conductive traces 740 such as bonding fingers on the top surface of the first molding compound 730. The conductive traces 740 may extend to the oblique sidewall of the first molding compound 730. The printed conductive traces 740 may be electrically connected to the conductive traces on or in the substrate 710. After the printing process, the printed conductive traces 740 may be subjected to a curing process. Optionally, a conductive layer such as Pt, Ag, or the like may be provided on the printed conductive traces 740.

A second semiconductor die 750 is then mounted on the first molding compound 730. Bonding wires 752 are formed to electrically connect the semiconductor die 750 to the conductive traces 740. Subsequently, the second semiconductor die 750 may be encapsulated by a second molding compound 760, thereby forming a package-on-package 7.

Figure 20:
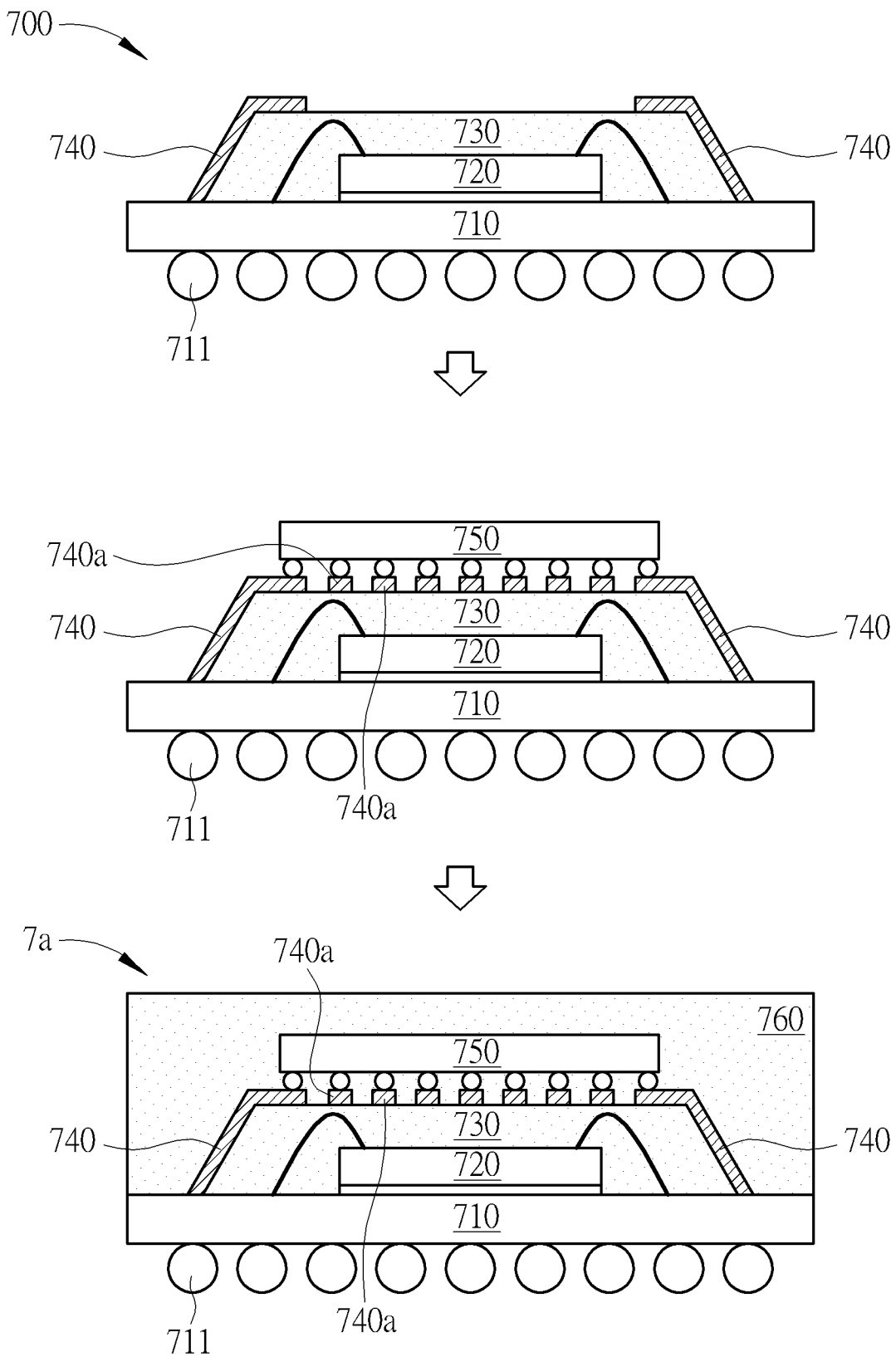

As shown in FIG. 20, likewise, a bottom package 700 is provided. The bottom package 700 comprises a first semiconductor die 720 mounted on a substrate 710. A plurality of solder balls 711 may be mounted on a lower surface of the substrate 710. The first semiconductor die 720 may be encapsulated by a first molding compound 730.

Although the first semiconductor die 720 is electrically connected to the substrate 710 through bonding wires in this figure, it is understood that the first semiconductor die 720 may be a flip chip in other embodiments.

Subsequently, a printing process such as a screen printing process or a 3D printing process may be performed to print conductive traces 740 including bond pads 740a on the top surface of the first molding compound 730. The conductive traces 740 may extend to the oblique sidewall of the first molding compound 730. The printed conductive traces 740 may be electrically connected to the conductive traces on the substrate 710. After the printing process, the printed conductive traces 740 may be subjected to a curing process. Optionally, a conductive layer such as Pt, Ag, or the like may be provided on the printed conductive traces 740.

A second semiconductor die 750 is then bonded on the bond pads 740a in a flip chip configuration. Subsequently, the second semiconductor die 750 may be encapsulated by a second molding compound 760, thereby forming a package-on-package 7a.

Figure 21:
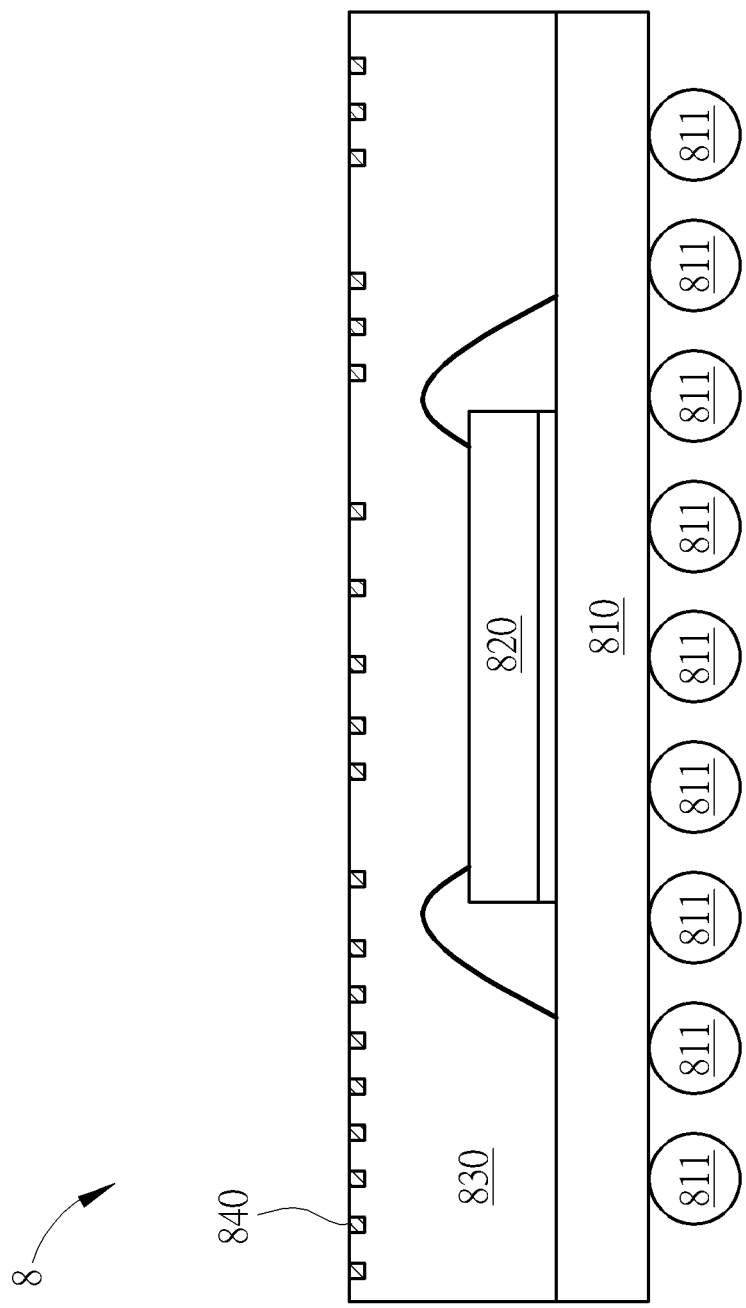
FIG. 21 is a schematic diagram showing a semiconductor chip package according to another embodiment of the invention.

Please refer to FIG. 21. FIG. 21 is a schematic diagram showing a semiconductor chip package according to another embodiment of the invention. As shown in FIG. 21, the semiconductor chip package 8 comprises a semiconductor die 820 mounted on a substrate 810 such as a package substrate. A plurality of solder balls 811 may be mounted on a lower surface of the substrate 810. The semiconductor die 820 may be encapsulated by a molding compound 830.

Although the semiconductor die 820 is electrically connected to the substrate 810 through bonding wires in this figure, it is understood that the semiconductor die 820 may be a flip chip in other embodiments.

A plurality of heat-dissipating features 840 are embedded in the top surface of the molding compound 830. To form the heat-dissipating features 840, first, trenches are formed by laser marking laser in the top surface of the molding compound 830, conductive paste such as copper paste is then printed onto the top surface of the molding compound 830 and fills the trenches. The trenches formed in the top surface of the molding compound 830 are laser marking trenches and may comprise various patterns, letters or numbers so as to exhibit certain information such as trademarks or model.

Figure 22:
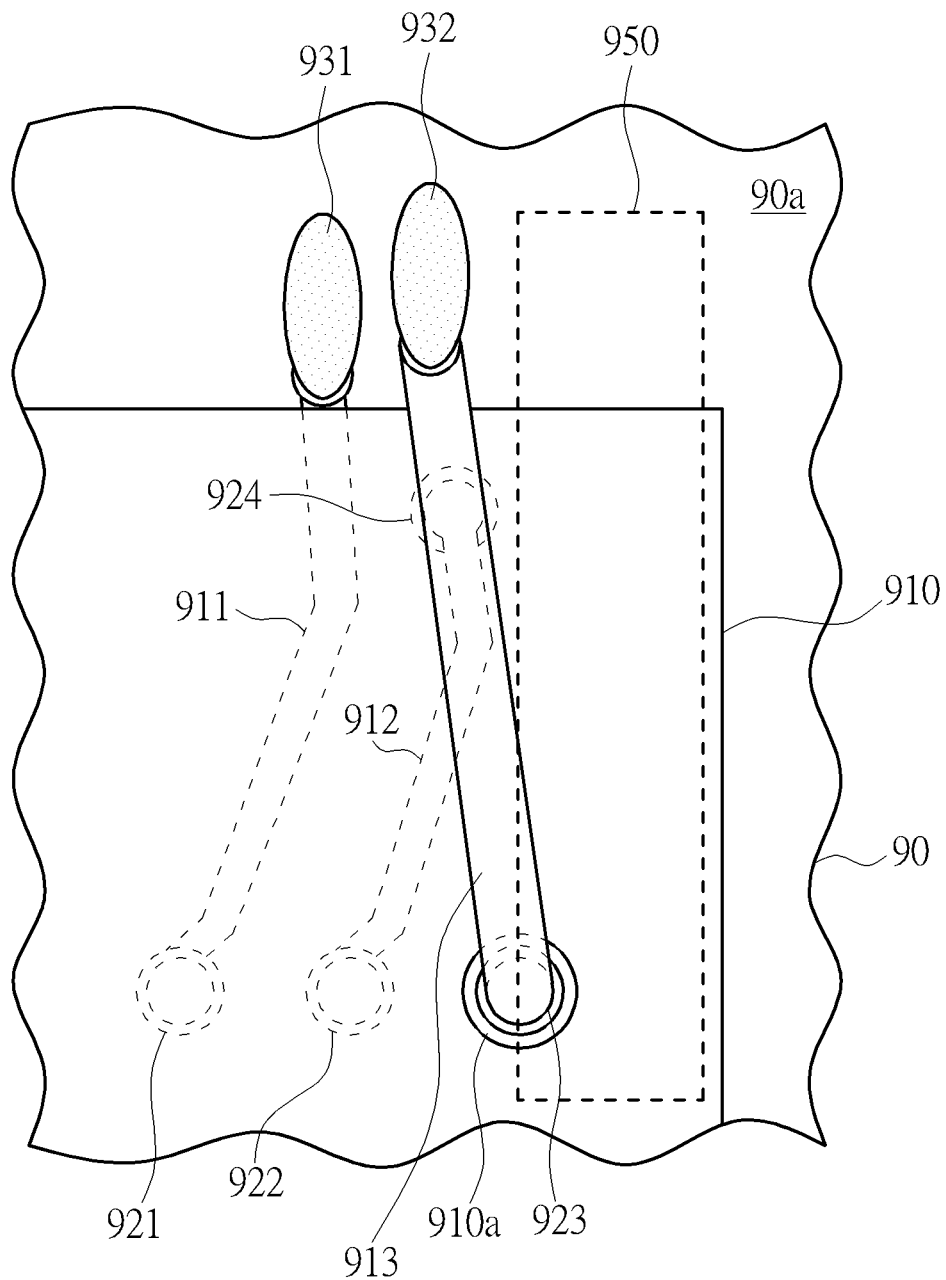
FIG. 22 is a schematic top view partially showing a layout of a substrate according to another embodiment of the invention.

FIG. 22 is a schematic top view partially showing a layout of a substrate according to another embodiment of the invention. The substrate may be a package substrate, a printed circuit board, or a printed wiring board.

As shown in FIG. 22, a plurality of conductive traces is formed on a top surface 90a of the substrate 90. For the sake of simplicity, only two traces 911 and 912 are shown in this figure. The traces 911 and 912 are covered with a solder mask 910. For example, the trace 911 interconnects a via 921 to a bonding finger 931 disposed outbound of the solder mask 910. The trace 912 may interconnect a via 922 to a via 924. In this embodiment, the trace 912, the via 922, and the via 924 are covered with the solder mask 910. A solder mask opening 910a is formed in the solder mask 910 to expose a via 923.

A conductive trace 913 is disposed over the solder mask 910 to electrically connect the bonding finger 932 to the via 923. The conductive trace 913 may be printed over the solder mask 910 by using a screen printing process or a 3D printing method. The conductive trace 913 may comprise conductive paste such as copper paste and may be subjected to a curing process. By providing such trace-over-solder mask configuration, a region 950 under the solder mask 910 may be spared so as to increase the routing flexibility of the substrate 90.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor chip package, comprising:
   a substrate;
   a semiconductor die mounted on the substrate, wherein the semiconductor die comprises a bond pad disposed on an active surface of the semiconductor die, and a passivation layer covering perimeter of the bond pad, wherein a bond pad opening in the passivation layer exposes a central area of the bond pad;
   a resilient conductive paste printed on an exposed central area of the bond pad; and
   a bonding wire secured to a top surface of the resilient conductive paste, wherein the resilient conductive paste comprises copper paste.

2. The semiconductor chip package according to claim 1, wherein the copper paste comprises epoxy resin and copper powder or silver-coated copper balls as filler.

3. The semiconductor chip package according to claim 1, wherein the copper paste completely fills up the bond pad opening, wherein a peripheral sidewall of the copper paste is in direct contact with the passivation layer.

4. A semiconductor chip package, comprising:
a substrate;
a semiconductor die mounted on the substrate, wherein the semiconductor die comprises a bond pad disposed on an active surface of the semiconductor die, and a passivation layer covering perimeter of the bond pad, wherein a bond pad opening in the passivation layer exposes a central area of the bond pad;
a resilient conductive paste printed on an exposed central area of the bond pad; and
a bonding wire secured to a top surface of the resilient conductive paste,
wherein the resilient conductive paste does not completely fill up the bond pad opening, wherein a peripheral sidewall of the resilient conductive paste is not in direct contact with the passivation layer.

5. The semiconductor chip package according to claim 1 further comprising a conductive layer coated on the top surface of the resilient conductive paste.

6. The semiconductor chip package according to claim 1 further comprising an encapsulant material molded over the substrate.

7. The semiconductor chip package according to claim 1, wherein the passivation layer comprises a polyimide layer.

8. The semiconductor chip package according to claim 1, wherein the bond pad is an aluminum bond pad.

9. A semiconductor chip package, comprising:
a substrate;
a semiconductor die mounted on the substrate, wherein the semiconductor die comprises a bond pad disposed on an active surface of the semiconductor die, and a passivation layer covering perimeter of the bond pad, wherein a bond pad opening in the passivation layer exposes a central area of the bond pad;
a resilient conductive paste printed on an exposed central area of the bond pad;
a conductive trace printed on the passivation layer and being electrically connected to the resilient conductive paste;
a redistributed bond pad printed on the passivation layer, wherein the redistributed bond pad is electrically connected to the resilient conductive paste through the conductive trace; and
a bonding wire secured to a top surface of the redistributed bond pad.

10. The semiconductor chip package according to claim 9, wherein the resilient conductive paste is structurally integral with the conductive trace and the redistributed bond pad.

11. The semiconductor chip package according to claim 9 further comprising an insulating layer on the passivation layer, and wherein the insulating layer covers the resilient conductive paste, the conductive trace, and the redistributed bond pad, and wherein the insulating layer comprises an opening exposing the redistributed bond pad.

12. The semiconductor chip package according to claim 11, wherein the insulating layer comprises a molding compound.

13. The semiconductor chip package according to claim 9 further comprising a passive element printed on the passivation layer.

14. The semiconductor chip package according to claim 9, wherein the resilient conductive paste comprises copper paste.

\* \* \* \* \*